Figure 1:
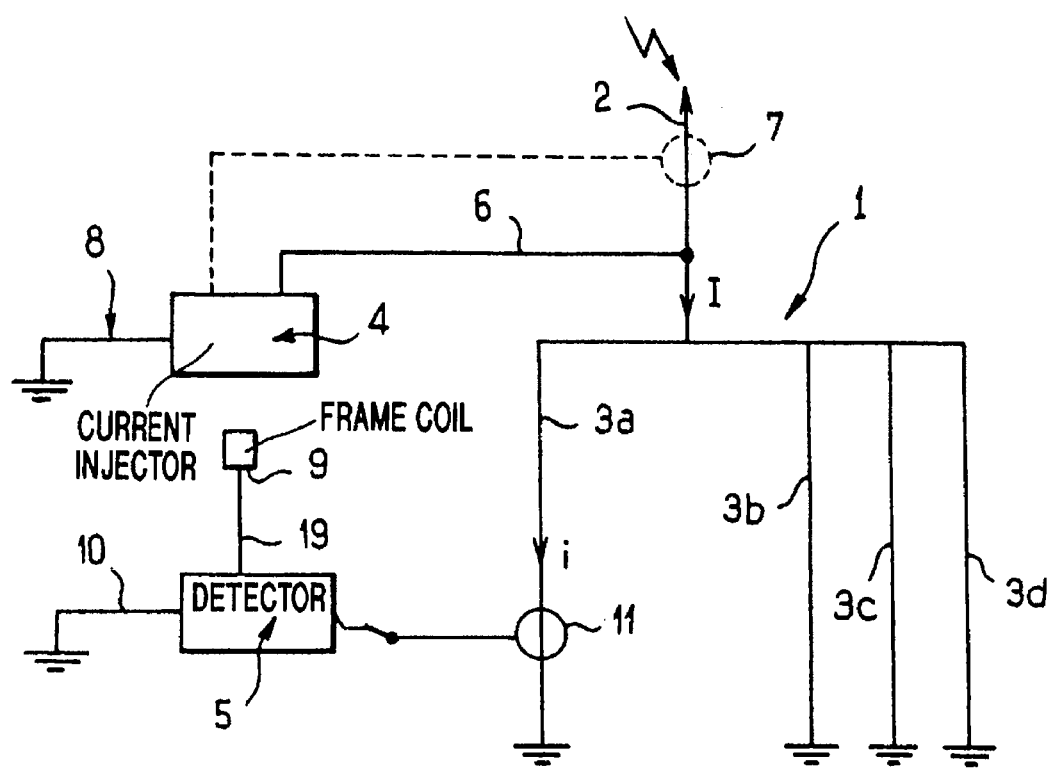

United States Patent [19]

Query et al.

[11] Patent Number: 5,654,641
[45] Date of Patent: Aug. 5, 1997

[54] METHOD AND DEVICE FOR TESTING THE EFFECTIVENESS OF A LIGHTING GROUND SYSTEM

[75] Inventors: Jean-Louis Query, Villeurbanne; Philippe Seltner, Decines Charpieu, both of France

[73] Assignee: Electricite de France (Service National), Paris, France

[21] Appl. No.: 520,919

[22] Filed: Aug. 30, 1995

[30] Foreign Application Priority Data

Sep. 1, 1994 [FR] France .................... 94 10522

[51] Int. Cl.$^6$ .................................. G01R 31/08
[52] U.S. Cl. .................... 324/529; 324/500; 324/509; 324/260
[58] Field of Search ................ 324/225, 244, 324/260, 500, 509, 512, 527, 528, 529

[56] References Cited

U.S. PATENT DOCUMENTS

| | | | |
|---|---|---|---|
| 4,142,143 | 2/1979 | Daniel | 324/544 |
| 4,198,599 | 4/1980 | Krider et al. | 324/72 |
| 4,297,633 | 10/1981 | McCutchan et al. | 324/500 |
| 4,706,016 | 11/1987 | Schweitzer, Jr. | 324/102 |
| 4,823,081 | 4/1989 | Geisler | 324/244 X |

OTHER PUBLICATIONS

Revue Generale De L'Electricite, Protection dynamique des installations et infrastructures sensibles aux effets electromagnetiques de la foudre, No. 5, May 1991 Paris, France, pp. 41–45.

Zischank, "Simulation von Blitzströmen bei direkten Einschlägen", Elektrotechnishe Zeitschrift, vol. 105 No. 1, Jan. 1985, Berlin, DE, pp. 12–17.

*Primary Examiner*—Kenneth A. Wieder
*Assistant Examiner*—Glenn W. Brown
*Attorney, Agent, or Firm*—Blakely Sokoloff Taylor & Zafman

[57] ABSTRACT

The invention concerns a method for verifying the effectiveness at a given measurement location of a lightning ground system including at least one pick-up member connected to a ground conductor. The method includes the steps of feeding a current to at least one pick-up member by means of an injector device, measuring the magnetic field generated by the ground conductor at the measurement location using a detector device generating a measurement signal the amplitude of which is representative of the magnetic field, and comparing the amplitude of the measurement signal with a reference threshold corresponding to the amplitude of the measurement signal at a reference location a known distance from the ground conductor and in the field of protection of the lightning ground system in order to deduce therefrom, if the amplitude of the measurement signal is greater than the reference threshold, that the measurement location is in the field of protection of the lightning ground system.

8 Claims, 2 Drawing Sheets

METHOD AND DEVICE FOR TESTING THE EFFECTIVENESS OF A LIGHTING GROUND SYSTEM

The present invention concerns lightning protection and in particular a method and a device for determining the effectiveness of a lightning protection device also known as a lightning ground system.

A lightning ground system includes at least one pick-up member (metal rod, conductive wire, etc) installed at the top of the building or other installation to be protected connected to a ground conductor or preferably to a network of ground conductors forming a Faraday cage.

The coverage of a lightning ground system can be estimated by modelling the propagation of lightning in the form of a descending sphere whose radius, known as the strike radius, depends on the intensity of the flash. The first point on the building or the installation that this sphere contacts is that at which the lightning is likely to strike. It is therefore necessary to ensure that this point is a pick-up member of the lightning ground system or a conductor of the array of ground conductors. This verification can be difficult if the building or the installation to be protected has a complicated geometry.

An object of the present invention is to propose a method and a device facilitating verification of the effectiveness of a lightning ground system.

The method of the invention, which determines if a given measurement location is in the field of protection of a lightning ground system, is characterized in that it comprises the steps of:

feeding a current to said ground conductor by means of an injector device, measuring the magnetic field generated by said ground conductor at said measurement location using a detector device generating a measurement signal the amplitude of which is representative of said magnetic field, comparing the amplitude of said measurement signal with a reference threshold corresponding to the amplitude of the measurement signal at a reference location a known distance from said ground conductor and in the field of protection of the lightning ground system in order to deduce therefrom, if the amplitude of said measurement signal is greater than the reference threshold, that said measurement location is in the field of protection of the lightning ground system.

Advantageously, the current in said ground conductor is measured by means of the detector device and variations of the reference threshold are determined from variations in the amplitude of the measured current.

Preferably, the current is injected into said conductor intermittently.

Advantageously, the injected current is a low-frequency current, preferably a current at a frequency below 30 kHz.

If the lightning ground system comprises at least one pick-up member connected to at least two ground conductors, the return path for the injected current to the injector device preferably comprises a plurality of return conductors grounded at locations relative to the point at which said ground conductors are grounded so that the injected current is divided uniformly between said ground conductors.

The invention also consists in a device for implementing the above method, comprising:

an injector device for injecting a current into a ground conductor, a detector device for measuring the magnetic field generated by said ground conductor at a given measurement location to determine whether that location is protected or not, the detector device being adapted to produce a measurement signal representative of said magnetic field to enable comparison of the amplitude of said measurement signal with a reference threshold corresponding to the amplitude of the measurement signal produced at a reference location at a known distance from said ground conductor and in the field of protection of the lightning ground system.

Figure 2:
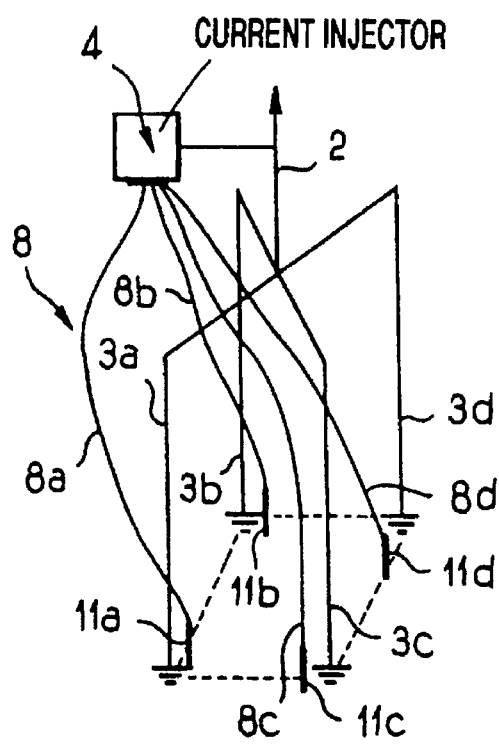
Figure 3:
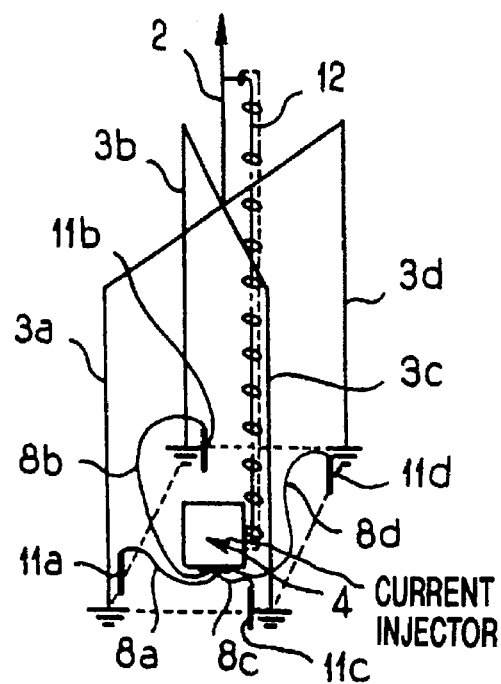
Figure 4:
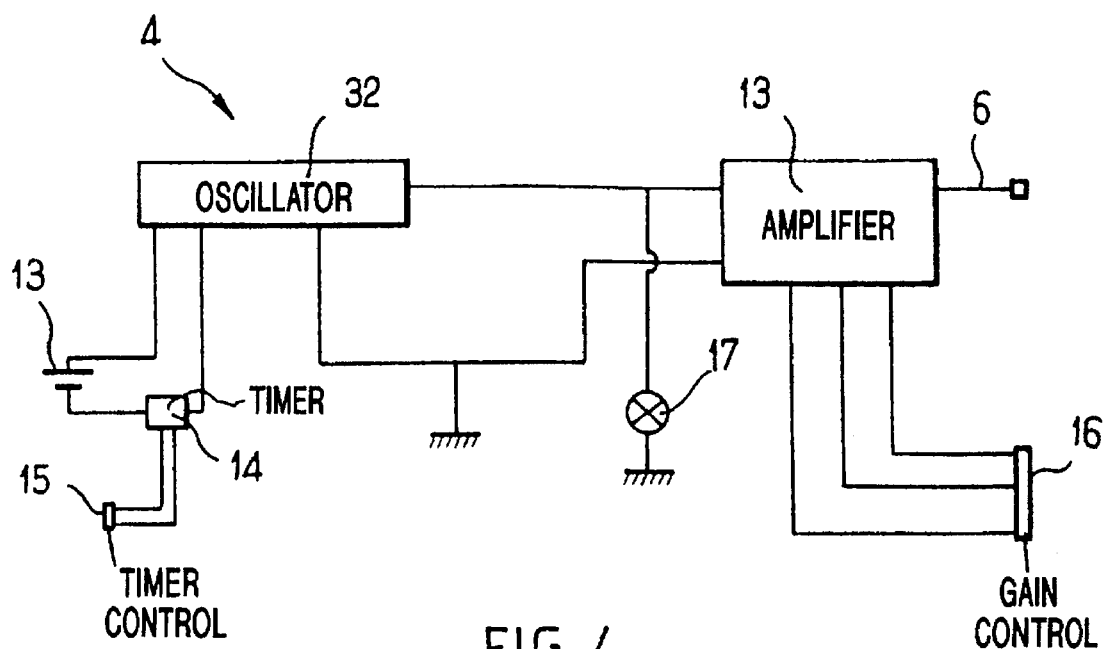
Figure 5:
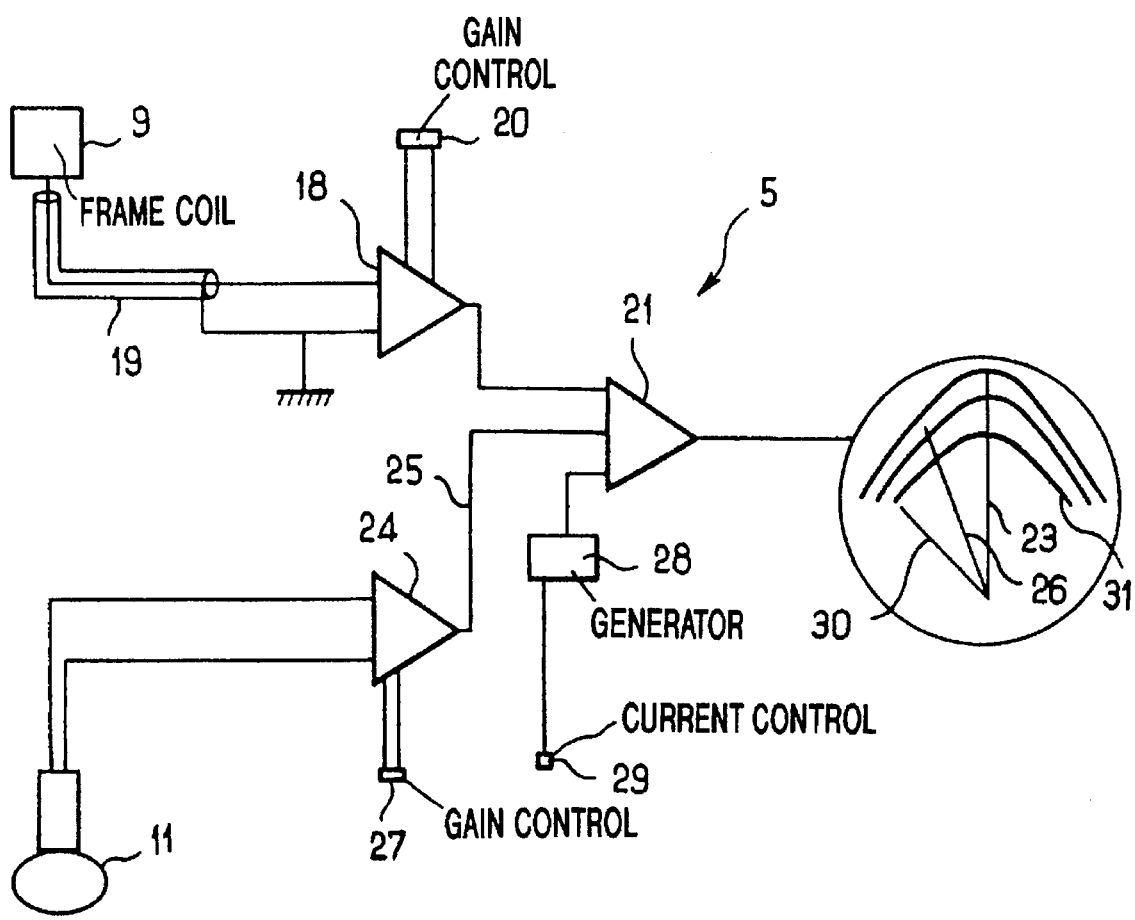

Other features and advantages of the present invention will emerge from a reading of the following detailed description of one non-limiting embodiment of the invention and from an examination of the appended drawings, in which:

FIG. 1 shows a current injector device and a detector device used in the method of the invention, FIGS. 2 and 3 show two possible uses of a detector device in the method of the invention, FIG. 4 is a block diagram of an injector device of the invention, and FIG. 5 is a block diagram of a detector device of the invention.

FIG. 1 is a diagram showing a lightning protection device 1 comprising a pick-up member 2 (for example a metal rod) to be installed at the top of a building or other installation to be protected, connected to a network of grounding conductors. In the example described the pick-up member 2 is connected to four ground conductors $3a$, $3b$, $3c$ and $3d$ installed on North, East, South and West faces, respectively, of the building or installation to form a Faraday cage. The distribution of the current in the pick-up member 2 between the conductors $3a$, $3b$, $3c$ and $3d$ depends on the impedance of the latter. If the impedances are the same, the current in the pick-up member 2 is divided into four equal currents in the conductors $3a$, $3b$, $3c$ and $3d$. The invention naturally applies regardless of the number of ground conductors and their nature (cables, metal structures, etc).

A current I is injected into the pick-up member 2 by a current injector device 4 of the invention. A detector device 5 is used to measure the magnetic field as a given measurement location to determine if that location is in the field of protection of the lightning ground system or not.

The current I can be injected by electrical contact with the pick-up member 2 as shown in FIG. 1, using an electric cable 6 having a clamp at the end, or by induction using a loop 7 through which the pick-up member 2 is passed. The return path for the current injected into the pick-up member 2 by the injector device 4 comprises a grounded electric cable or preferably a plurality of grounded electric cables 8, as described in more detail below.

The detector device 5 measures the magnetic field by means of a frame coil 9 or any equivalent means known to the person skilled in the art (Hall effect sensor, etc). The detector device 5 is grounded by an electric cable 10. According to one advantageous feature of the invention, and as described in more detail below, the detector device 5 also includes means for measuring the current $i$ in a ground conductor, advantageously a clamp ammeter 11 closed around the conductor. Alternatively, the current $i$ can be measured by a magnetic field sensor placed at a known distance from the conductor, subject to appropriate calibration beforehand.

The current can be returned to the injector device 4 in various ways, preferably by a plurality of return cables each connected to a metal spike driven into the ground. The disposition of the return cables is preferably symmetrical about a vertical line passing through the highest point on the building or other installation to be protected, where a pick-up member of the lightning ground system is theoretically located. The object of this arrangement of the return conductors on the ground is to achieve the most uniform distribution possible of the current fed to the pick-up member 2 in the ground conductors.

In the examples shown in FIGS. 2 and 3, the return path for the current comprises four electric cables 8a, 8b, 8c and 8d connected to respective spikes 11a, 11b, 11c and 11d near the points at which the conductors 3a, 3b, 3c and 3d are grounded, so that the current I injected into the pick-up member 2 is divided into four equal currents i, none of the ground conductors being favored over the others because of the symmetrical disposition of the return cables.

In the example shown in FIG. 2 the injector device 4 is installed at the top of the building or other installation equipped with the lightning ground system whose effectiveness is to be tested. The four return cables 8a, 8b, 8c and 8d are connected in common at one end to the injector device 4 and grounded at the other end through the ground spikes 11a, 11b, 11c and 11d.

In an alternative arrangement, shown in FIG. 3, the injector device 4 is at ground level and the current to be fed to the lightning ground system is fed to the pick-up member 2 by a coaxial conductor 12 connected to the injector device 4. This FIG. 3 solution is preferable because it avoids transportation of the injector device 4 to the top of the building or installation to be examined and because installation of the return cables 8a, 8b, 8c and 8d is not difficult.

FIG. 4 is a diagram showing one embodiment of the injector device 4 of the invention. The current is preferably injected intermittently, the intervening times being used to check that the magnetic field detected is only that due to the injected current, using the signal/noise ratio. For example, the current can be injected for continuous periods of 30 seconds separated by gaps of 10 seconds. In the FIG. 4 embodiment the injector device includes an oscillator 32 connected to an electrical power supply 13 in series with a timer 14 the on/off times of which are adjusted by control means 15. The oscillator 32 is therefore energized intermittently to generate cycles of continuous current injection separated by periods of no current injection. An amplifier 13 amplifies the output signal of the oscillator 32. The gain of the amplifier 13 is varied by control means 16 to vary the current fed to the lightning ground system.

In the example described the oscillator 32 includes a piezoelectric device generating pulses with a waveform similar to that of a lightning strike. A lamp 17 to indicate the sending of a pulse is provided at the output of the oscillator 32. As an alternative, the injected current can be a low-frequency sinusoidal current or a series of currents at various frequencies (100 Hz, 1 kHz, 10 kHz, 20 kHz, etc) preferably below 30 kHz. The output signal of the amplifier 13 is fed to the lightning ground system either directly through the cable 6 (FIG. 1) or inductively via the loop 7.

In an alternative embodiment the timer 14 and the oscillator 32 are replaced by a digital recorder, for example an ISD 1016 AB recorder. A signal (pulse, sinusoidal or other) is placed in memory in the recorder and then read repetitively by the recorder when the injector device is used.

FIG. 5 is a diagram showing the detector device 5. This device includes a first amplifier 18 receiving at its input the signal recovered by the frame coil 9 and fed to the amplifier 18 via a coaxial cable 19. The gain of the amplifier 18 is varied by control means 20. The output signal from the amplifier 18 is further amplified by amplifier means 21 to drive a meter the position of the pointer 23 of which indicates the amplitude of the magnetic flux through the frame coil 9. The pointer 23 advantageously moves across a scale graduated in percentages.

As shown in FIGS. 1 and 5, the detector device advantageously further includes means for measuring the amplitude of the current in a ground conductor. This local current measurement is effected inductively using the clamp ammeter 11 connected to an amplifier 24 with gain control means 27. The output 25 of the amplifier 24 is connected to the amplifier means 21 to drive a meter the pointer 26 of which indicates the amplitude of the current. Measuring the current in the ground conductors can detect a grounding fault on a ground conductor and avoids the need for further calibration of the detector device 4 if the current in the ground conductor generating the magnetic field measured by the frame coil 9 varies (this is described in more detail below).

Lightning striking the lightning ground system can be modelled by a descending sphere the radius of which depends on the intensity of the flash. In one known model this radius is expressed by the formula $R = 10.I_{Flash}^{2/3}$ (R in meters, $I_{Flash}$ in kA). The detector device 5 optionally includes a current generator 28 and control means 29 for varying the output current of the generator 28, for example a potentiometer graduated in values of the lightning current $I_{Flash}$. The generator 28 outputs a current representing the radius R corresponding to the lightning current $I_{Flash}$ selected by the potentiometer to be indicated by a pointer 30 of a meter moving across a scale 31 graduated in meters. A chart can be used instead of the generator 28, the control means 29 and the associated meter, of course.

The injector device 4 and the detector device 5 are used in the method of the invention as follows:

The injector device 4 is installed either on the building or on the ground, in the latter case the lightning ground system being fed with current by a coaxial cable 12 as shown in FIG. 3. A current I is injected intermittently into the pick-up member 2. The current I is divided into currents i, which in theory are of equal amplitude if the ground conductors 3a, 3b, 3c and 3d are not damaged and if the ground spikes 11a, 11b, 11c and 11d connected to the return cables 8a, 8b, 8c and 8d are installed appropriately. The detector device 5 is then calibrated at a known distance d from the pick-up member 2 or a ground conductor 3a, 3b, 3c and 3d of the lightning ground system. This distance d has to be less than the strike radius R for a given flash current $I_{Flash}$. If necessary, this is verified using the generator 28 or an equivalent chart. After checking that the point at the distance d from the selected conductor is in the field of protection of the lightning ground system, the magnetic field and the current in the conductor are measured at the distance d. The gain controls 20 and 27 are adjusted to set each of the pointers 23 and 26 to a reference graduation, for example the "100%" graduation. Then, by transporting the coil 9 around the same floor of the building or otherwise at the same height a check is carried out to see that the magnetic field is above the reference threshold at all measurement locations, to verify that all of the equipment to be protected is within the field of protection of the lightning ground system. Measurements are advantageously made at the nodes of a regular mesh. Coaxial cables can be used in the event of interference due to the return cable 8a, 8b, 8c and 8d when using the injector device shown in FIG. 2. It has been found in practice that disconnecting the return cable nearest the frame coil 9 is sufficient to eliminate the interference caused by the return current in that cable. Trials have shown that in this case the injected current is still divided in a sufficiently uniform way between the remaining three ground conductors 3a, 3b, 3c, 3d.

If moving the frame coil 9 around on the same floor or at the same height indicates that the measured field is below the reference threshold at a particular location, this location is insufficiently protected by the lightning ground system. In practice the reference distance $\underline{d}$ is a few meters and the measurement location is deemed to be insufficiently protected if the measured field is less than half the value of the field at the reference distance. Measuring the current in the ground conductors 3a, 3b, 3c and 3d verifies the absence of conduction defects therein. Also, if on moving to a different floor (or to a different height) the current in the ground conductor generating the magnetic field measured by the frame coil 9 varies, for example because the current is split between a plurality of branches, this current measurement also avoids the need to recalibrate the detector at a known distance. It is sufficient to modify the value of the reference threshold in the same proportion as the relative variation in the measured current. For example, if the current in the pick-up member 2 measured by the clamp ammeter 11 has the value I at the top of the building and the current is divided by four in the branches 3a, 3b, 3c and 3d on lower floors, the amplitude of the magnetic field at the distance $\underline{d}$ from each conductor 3a, 3b, 3c and 3d is one quarter the magnetic field at the distance $\underline{d}$ from the pick-up member 2. Consequently, if the gain of the amplifiers 18 and 24 was set at the top of the installation, it is sufficient to increase the gain of the amplifier 18 by a factor of 4 on lower floors to retain the same reference indication "100%" given by the pointer 23 at the distance $\underline{d}$ from each conductor 3a, 3b, 3c and 3d on lower floors.

The invention is not limited to the embodiment just described. The gain of the amplifier 18 can be varied automatically in accordance with the measured current in the ground conductor generating the magnetic field measured by the detector device 5. Any magnetic coil placed near the ground conductor, whether the conductor passes through it or not, can be used in place of a clamp ammeter 11. The meters referred to above can be replaced by any type of indicator device known to the person skilled in the art (digital or other display device, etc).

There is claimed:

1. Method for verifying the effectiveness at a given measurement location of a lightning ground system including at least one pick-up member connected to a ground conductor, comprising the steps of:

feeding a current to at least one pick-up member by means of an injector device, measuring the magnetic field generated by said ground conductor at said measurement location using a detector device generating a measurement signal the amplitude of which is representative of said magnetic field, comparing the amplitude of said measurement signal with a reference threshold corresponding to the amplitude of the measurement signal at a reference location a known distance $\underline{d}$ from said ground conductor and in the field of protection of the lightning ground system in order to deduce therefrom, if the amplitude of said measurement signal is greater than the reference threshold, that said measurement location is in the field of protection of the lightning ground system.

2. Method according to claim 1 wherein the current in said ground conductor is measured by means of the detector device and variations of the reference threshold are determined from variations in the amplitude of the measured current.

3. Method according to claim 1 wherein the current is injected into said conductor intermittently.

4. Method according to claim 3 wherein the injected current is a low-frequency current, preferably a current at a frequency below 30 kHz.

5. Method according to claim 1, the lightning ground system comprising at least one pick-up member connected to at least two ground conductors, wherein the return path for the injected current to the injector device comprises a plurality of return conductors grounded at locations relative to the point at which said ground conductors are grounded so that the injected current is divided uniformly between said ground conductors.

6. Device for verifying the effectiveness at a given measurement location of a lightning ground system comprising at least one pick-up member connected to a ground conductor, comprising:

an injector device for injecting a current into at least one pick-up member, a detector device for measuring the magnetic field generated by said ground conductor at a given measurement location to determine whether that location is protected or not, the detector device being adapted to produce a measurement signal representative of said magnetic field to enable comparison of the amplitude of said measurement signal with a reference threshold corresponding to the amplitude of the measurement signal produced at a reference location at a known distance from said ground conductor and in the field of protection of the lightning ground system.

7. Device according to claim 6 further comprising means for measuring the current in said ground conductor.

8. Device according to claim 7 wherein the injector device includes an oscillator which includes a piezoelectric device producing pulses with a waveform similar to that of a lightning strike.

* * * * *

UNITED STATES PATENT AND TRADEMARK OFFICE
CERTIFICATE OF CORRECTION

| | | |
|---|---|---|
| PATENT NO. | : | 5,654,641 |
| DATED | : | August 5, 1997 |
| INVENTOR(S) | : | Query et al. |

It is certified that error appears in the above-identified patent and that said Letters Patent is hereby corrected as shown below:

In the title page, item [54], please delete " LIGHTING " and insert -- LIGHTNING --.

Column 1, line 2, please delete "LIGHTING" and insert --LIGHTNING--.

Signed and Sealed this

Second Day of June, 1998

*Attest:*

BRUCE LEHMAN

*Attesting Officer*  *Commissioner of Patents and Trademarks*